United States Patent
Jiang et al.

(10) Patent No.: US 9,583,508 B2
(45) Date of Patent: Feb. 28, 2017

(54) ARRAY SUBSTRATE, PREPARATION METHOD FOR ARRAY SUBSTRATE, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaohui Jiang, Beijing (CN); Jian Guo, Beijing (CN); Jiaxiang Zhang, Beijing (CN); Zongmin Tian, Beijing (CN)

(73) Assignees: BOE TECHNOLOGY GROUP CO., LTD., Beijing (CN); BEIJING BOE OPTOELECTRONICS CO., LTD., Beijing (CN)

( * ) Notice: Subject to any disclaimer, the term of this patent is extended or adjusted under 35 U.S.C. 154(b) by 0 days.

(21) Appl. No.: 14/499,502

(22) Filed: Sep. 29, 2014

(65) Prior Publication Data

US 2015/0236053 A1    Aug. 20, 2015

(30) Foreign Application Priority Data

Feb. 17, 2014    (CN) .......................... 2014 1 0052964

(51) Int. Cl.
*H01L 27/12*    (2006.01)
*H01L 29/66*    (2006.01)
(Continued)

(52) U.S. Cl.
CPC ...... *H01L 27/1222* (2013.01); *H01L 21/0273* (2013.01); *H01L 21/308* (2013.01);
(Continued)

(58) Field of Classification Search
CPC ............. H01L 27/1222; H01L 27/1259; H01L 21/308; H01L 21/32133; H01L 29/41733;
(Continued)

(56) References Cited

U.S. PATENT DOCUMENTS

2005/0077523 A1* 4/2005 Ahn ................. G02F 1/136213
257/72
2006/0023138 A1 2/2006 Choi et al.
(Continued)

FOREIGN PATENT DOCUMENTS

CN    1610110 A    4/2005
CN    1987622 A    6/2007
(Continued)

OTHER PUBLICATIONS

Notification of the First Office Action dated Nov. 4, 2015 corresponding to Chinese application No. 201410052964.0.
(Continued)

*Primary Examiner* — Whitney T Moore
(74) *Attorney, Agent, or Firm* — Nath, Goldberg & Meyer; Joshua B. Goldberg; Scott Blackman

(57) ABSTRACT

The present invention discloses an array substrate, a preparation method for the array substrate, and a display device, wherein the array substrate comprises a gate electrode, a gate insulation layer, an active layer, a source electrode and a drain electrode, and a pixel electrode arranged on a substrate, the active layer includes an electric conduction area, a coverage area covered by the source electrode and the drain electrode, and an exposure area surrounding the coverage area, and the pixel electrode is lapped on the upper surfaces of the drain electrode, the exposure area of the active layer, and the gate insulation layer. According to the present invention, the pixel electrode breaks in the area, with the large gradient angle, of the drain electrode caused by
(Continued)

slip-down due to gravity can be avoided, and the lap joint for the pixel electrode and the drain electrode is effectively facilitated.

14 Claims, 2 Drawing Sheets

(51) Int. Cl.
    *H01L 29/423*     (2006.01)
    *H01L 29/786*     (2006.01)
    *H01L 29/417*     (2006.01)
    *H01L 21/3213*     (2006.01)
    *H01L 21/308*     (2006.01)
    *H01L 21/027*     (2006.01)
    *H01L 21/311*     (2006.01)

(52) U.S. Cl.
    CPC .. *H01L 21/31138* (2013.01); *H01L 21/32133* (2013.01); *H01L 21/32136* (2013.01); *H01L 21/32139* (2013.01); *H01L 27/1259* (2013.01); *H01L 29/41733* (2013.01); *H01L 29/42384* (2013.01); *H01L 29/66765* (2013.01); *H01L 29/78669* (2013.01); *H01L 29/78678* (2013.01)

(58) Field of Classification Search
    CPC ......... H01L 29/42384; H01L 29/66765; H01L 29/78669; H01L 29/78678
    See application file for complete search history.

(56) References Cited

U.S. PATENT DOCUMENTS

| | | | |
|---|---|---|---|
| 2007/0153151 A1* | 7/2007 | Yang | G02F 1/136227 349/43 |
| 2012/0007086 A1* | 1/2012 | Oh | H01L 29/458 257/59 |
| 2012/0315715 A1* | 12/2012 | Cho | G02F 1/1368 438/30 |
| 2015/0155303 A1* | 6/2015 | Kim | H01L 27/124 257/59 |

FOREIGN PATENT DOCUMENTS

| | | |
|---|---|---|
| CN | 1991544 A | 7/2007 |
| CN | 102110693 A | 6/2011 |
| CN | 102819156 A | 12/2012 |
| CN | 103199060 A | 7/2013 |
| JP | 0541391 A | 2/1993 |

OTHER PUBLICATIONS

2nd office action issued in corresponding Chinese application No. 201410052964.0 dated Mar. 14, 2016.

\* cited by examiner

ARRAY SUBSTRATE, PREPARATION METHOD FOR ARRAY SUBSTRATE, AND DISPLAY DEVICE

FIELD OF THE INVENTION

The present invention relates to the field of display technology, and particularly relates to an array substrate and a preparation method for the same, and a display device using the array substrate.

BACKGROUND OF THE INVENTION

FIG. 1 is a structural schematic diagram of an array substrate in the prior art. As shown in FIG. 1, the array substrate in the prior art comprises a gate electrode 2, a gate insulation layer (GI) 3, an active layer 4, ohmic contact layers 5, a source electrode 61 and a drain electrode 62 which are sequentially arranged on a substrate 1, and a pixel electrode (ITO) 7 which is lapped on the upper surfaces of the drain electrode 62 and the gate insulation layer 3.

Under normal circumstances, the preparation method for the array substrate is: forming the gate electrode 2 on the substrate 1 at first; then forming the gate insulation layer 3, the active layer 4 and the ohmic contact layers 5; then forming the source electrode 61 and the drain electrode 62; and finally forming the pixel electrode 7.

During the process of forming the source electrode 61 and the drain electrode 62, a wet etching process is adopted, although wet etching is simple and convenient to operate and has low requirements on equipment, the anisotropy of the chemical reactions thereof is poor, the line width of a pattern on a film is less than that of a pattern on an anti-corrosion agent film due to transversal etching, and therefore, accurate control performance is poor. Anisotropy is also referred to as non-uniformity, and means that all or a part of physicochemical properties of an object represent difference to a certain extent respectively with different directions, one important characteristic that an ideal etching process needs to have is good aeolotropic etching, that is, only vertical etching exists and no transversal etching exists. In this way, accurate etching on the etched film for a geometric pattern which is identical to that on the anti-corrosion agent film can be ensured.

In the prior art, during a preparation process of the source electrode 61 and the drain electrode 62, the anisotropy and accurate control performance of wet etching are poor, therefore, a gradient angle a formed on the side surface of the drain electrode 62 after the etching is finished is large, and the gradient angle a is in a range of 80-90 degrees; meanwhile, the thicknesses of the source electrode metal layer and the drain electrode metal layer are in a range of 2000-4000 Å, the pixel electrode metal layer is thin, and the thickness thereof is in a range of 400-700 Å, therefore, during deposition for the pixel electrode metal layer, the slip-down occurs on the side surface of the gradient angle a due to gravity action, thus the pixel electrode metal layer herein is thin and even is broken, poor lap joint for the formed pixel electrode 7 and drain electrode 62 is easily caused, and product quality is seriously influenced.

Therefore, the technical problem to be solved by a person skilled in the art is how to provide a preparation method for an array substrate, which is capable of facilitating lap joint for a pixel electrode and a drain electrode.

SUMMARY OF THE INVENTION

The technical problem to be solved by the present invention is to provide a preparation method for an array substrate, which is capable of facilitating lap joint for a pixel electrode and a drain electrode.

The technical solution adopted for solving the technical problem of the present invention is as follows.

An array substrate, comprising a gate electrode, a gate insulation layer, an active layer, a source electrode and a drain electrode, and a pixel electrode which are arranged on a substrate; the active layer includes an electric conduction area, a coverage area covered by the source electrode and the drain electrode, and an exposure area surrounding the outer side of the coverage area; and the pixel electrode is lapped on the upper surfaces of the drain electrode, the exposure area of the active layer, and the gate insulation layer.

Preferably, in the array substrate above, the width of the exposure area of the active layer is in a range of 0.5 μm-1.0 μm.

Preferably, the array substrate above further comprises ohmic contact layers located between the active layer and the source electrode and the drain electrode, and the ohmic contact layers are located in areas corresponding to the source electrode and the drain electrode.

Preferably, in the array substrate above, the thickness of the coverage area of the active layer is greater than that of the exposure area of the active layer.

The present invention further discloses a preparation method for the array substrate, comprising: forming on a substrate a pattern comprising a gate electrode, a gate insulation layer, and a pattern comprising an active layer, and further comprising:

step 1: forming a source electrode and a drain electrode by a patterning process so that the pattern of the active layer includes an electric conduction area, a coverage area covered by the source electrode and the drain electrode, and an exposure area surrounding the outer side of the coverage area; and step 2: forming a pixel electrode on the upper surfaces of the drain electrode, the exposure area of the active layer, and the gate insulation layer.

Preferably, in the preparation method above, the step 1 comprises:

step 101: coating a layer of source-drain electrode layer film above the pattern of the active layer, coating photoresist on the source-drain electrode layer film, exposing and developing, and then etching the source-drain electrode layer film to form patterns of the source electrode and the drain electrode;

step 102: treating the edge of the photoresist reserved on the source electrode and the drain electrode, so as to expose the source electrode and the drain electrode below the outer edge of the photoresist;

step 103: etching the source electrode and the drain electrode exposed in step 102, so as to expose the active layer below the outer edges of the source electrode and the drain electrode to form the exposure area of the active layer; and step 104: stripping off the photoresist on the source electrode and the drain electrode.

Preferably, in the preparation method above, the step 102 comprises: bombarding the photoresist by sulphur hexafluoride and oxygen to shrink the photoresist, so as to expose the source electrode and the drain electrode below the edge of the photoresist.

Preferably, in the preparation method above, the content of sulphur hexafluoride is in a range of 30-50 sccm, the content of oxygen is in a range of 1500-2500 sccm, a bombarding power is in a range of 4500-5500 W, and a treatment time is in a range of 30-40 s.

Preferably, in the preparation method above, the step 103 comprises: etching the exposed source electrode and drain electrode by chlorine and oxygen.

Preferably, in the preparation method above, the content of chlorine is in a range of 800-1000 sccm, the content of oxygen is in a range of 1600-2000 sccm, a bombarding power is in a range of 3500-4500 W, a pressure is in a range of 30-40 mT, and a treatment time is in a range of 35-85 s.

Preferably, in the preparation method above, the step 101 further comprises: forming a pattern comprising ohmic contact layers among the active layer, the source electrode and the drain electrode by the patterning process.

Preferably, in the preparation method above, the step 1 further comprises: etching the ohmic contact layers by sulphur hexafluoride, chlorine and helium, so as to remove the ohmic contact layer corresponding to the electric conduction area of the active layer, and reserve the ohmic contact layer below areas corresponding to the source electrode and the drain electrode; meanwhile, partially etching the exposure area of the active layer so that the thickness of the coverage area of the active layer is greater than that of the exposure area of the active layer.

The present invention further discloses a display device, comprising an array substrate, wherein the array substrate is the array substrate above.

The present invention has the following beneficial effects:

The array substrate provided by the present invention comprises a gate electrode, a gate insulation layer and an active layer which are arranged on a substrate, wherein the active layer includes an electric conduction area, a coverage area covered by the source electrode and the drain electrode, and an exposure area surrounding the outer side of the coverage area, and a pixel electrode is lapped on the upper surfaces of the drain electrode, the exposure area of the active layer, and the gate insulation layer. It can be seen, due to the existence of the exposure area of the active layer, during deposition for a pixel electrode layer film, the pixel electrode layer film may fall onto the exposure area of the active layer in an area, with a large gradient angle, of the drain electrode, thus avoiding the case that the pixel electrode breaks in the area, with the large gradient angle, of the drain electrode caused by slip-down due to gravity, and effectively facilitating the lap joint for the pixel electrode and the drain electrode.

The present invention further provides a preparation method for an array substrate, which is capable of preparing the array substrate above, thus effectively facilitating the lap joint for the pixel electrode and the drain electrode.

The present invention further provides a display device with the array substrate above, and with the adoption of the array substrate above, the display effect of the display device is better, and product yield is higher.

The corresponding relationships between the reference signs in the accompanying drawings above and component names are as follows:

1: substrate; 2: gate electrode; 3: gate insulation layer; 4: active layer; 5: ohmic contact layer; 61: source electrode; 62: drain electrode; 7: pixel electrode; 8: photoresist.

DETAILED DESCRIPTION OF THE EMBODIMENTS

To make the person skilled in the art better understand the technical solution of the present invention, the present invention is further described below in detail in conjunction with the accompanying drawings and the specific embodiments.

Figure 1:
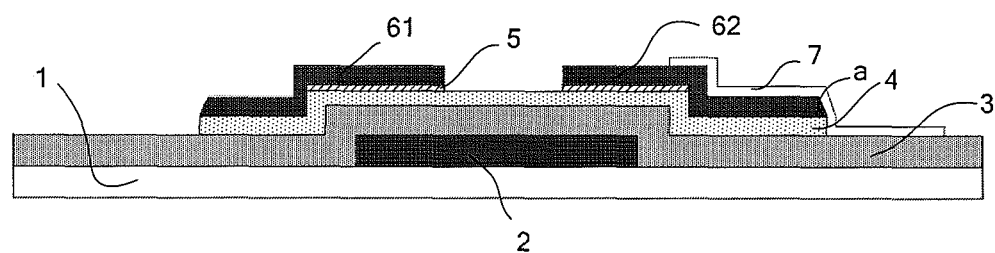
FIG. 1 is a structural schematic diagram of an array substrate in the prior art.
Figure 2:
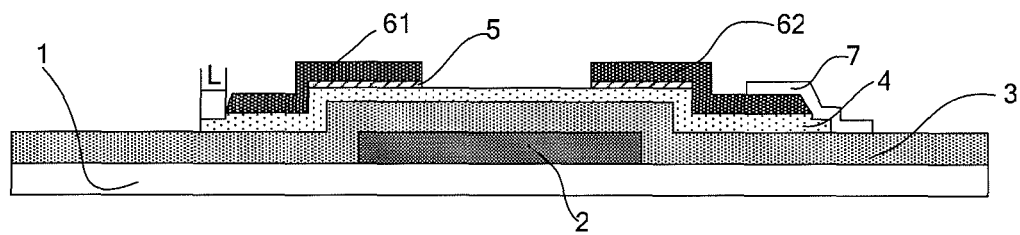
FIG. 2 is a structural schematic diagram of an array substrate provided by the embodiments of the present invention.

With reference to FIG. 2, FIG. 2 is a structural schematic diagram of an array substrate provided by the embodiments of the present invention.

As shown in FIG. 2, the array substrate provided by the embodiments of the present invention comprises a gate electrode 2, a gate insulation layer 3, an active layer 4, a source electrode 61 and a drain electrode 62, and a pixel electrode 7 which are arranged on a substrate 1, the active layer 4 includes an electric conduction area, a coverage area covered by the source electrode 61 and the drain electrode 62, and an exposure area surrounding the outer side of the coverage area, and the pixel electrode 7 is lapped on the upper surfaces of the drain electrode 62, the exposure area of the active layer 4, and the gate insulation layer 3. It can be seen, due to the existence of the exposure area of the active layer 4, during deposition for a pixel electrode metal layer, the pixel electrode layer may fall onto the exposure area of the active layer 4 in an area, with a large gradient angle, of the drain electrode 62, and the exposure area of the active layer 4 is basically a horizontal plane and plays a certain slow-down role on the gradient angle of the drain electrode 62, thus avoiding the case that the pixel electrode 7 breaks in the area, with the large gradient angle, of the drain electrode 62 caused by slip-down due to gravity, and effectively facilitating the lap joint for the pixel electrode 7 and the drain electrode 62. It needs to be noted that, the electric conduction area of the active layer refers to a channel area, that is, an area located between the source electrode and the drain electrode, in the active layer, which is not covered by the source electrode and the drain electrode.

Specifically, the width L of the exposure area of the active layer above is in a range of 0.5 μm-1.0 μm, as shown in FIG. 2, a distance between the outer edge of the exposure area of the active layer above and the outer edge of the coverage area of the active layer is in a range of 0.5 μm-1.0 μm, and within the range, the lap joint for the pixel electrode 7 and the drain electrode 62 can be effectively facilitated.

In order to facilitate the ohmic contact performance between the active layer 4 and the source electrode 61 and the drain electrode 62, the array substrate provided by the present invention further comprises ohmic contact layers 5 located between the active layer 4 above and the source electrode 61 and the drain electrode 62, and specifically, the ohmic contact layers 5 are located in areas corresponding to the source electrode 61 and the drain electrode 62.

In order to further optimize the technical solution above, in one embodiment of the present invention, in the active layer 4, the thickness of the coverage area of the active layer 4 is greater than that of the exposure area, thus forming a step. In this way, during deposition for a pixel electrode layer film, the pixel electrode layer film may fall onto the step in an area, with a large gradient angle, of the drain electrode 62, and slowing down the gradient of the side surface of the drain electrode 62, thus further facilitating the lap joint for the pixel electrode 7 and the drain electrode 62.

The present invention further provides a preparation method for the array substrate, comprising: on a substrate 1, forming a pattern comprising a gate electrode 2, a gate insulation layer 3, and a pattern comprising an active layer 4, and further comprising:

step 1: forming a source electrode and a drain electrode by a patterning process, so that the pattern of the active layer includes an electric conduction area, a coverage area covered by the source electrode and the drain electrode, and an exposure area surrounding the outer side of the coverage area; and step 2: forming a pixel electrode on the upper surfaces of the drain electrode, the exposure area of the active layer, and the gate insulation layer.

The array substrate prepared by the preparation method for the array substrate provided by the present invention is the array substrate above, because the array substrate above has the technical effects above, the array substrate prepared by the preparation method for the array substrate provided by the present invention should also have the same technical effects, that is, with respect to the array substrate prepared by the preparation method for the array substrate provided by the present invention, due to the existence of the exposure area of the active layer 4, during deposition for a pixel electrode layer film, the pixel electrode layer film may fall onto the exposure area of the active layer 4 in an area, with a large gradient angle, of the drain electrode 62, and as the exposure area of the active layer 4 is basically a horizontal plane and thus plays a certain slow-down role on the gradient angle of the drain electrode 62, thereby avoiding the case that the pixel electrode 7 breaks in the area, with the large gradient angle, of the drain electrode 62 caused by slip-down due to gravity, and effectively facilitating the lap joint for the pixel electrode 7 and the drain electrode 62.

Before illustration of the specific preparation method, it should be understood that, in the present invention, the patterning process may only comprise a photoetching process, or comprise a photoetching process and etching steps, and may also comprise other processes for forming predetermined patterns such as printing and ink jet; the photoetching process refers to a process of forming patterns by photoresist, a mask plate, an exposure machine and the like, and comprising the technical processes of film formation, exposure, development and the like. The corresponding patterning process may be selected according to the structure of the array substrate formed in the present invention.

Figure 3:
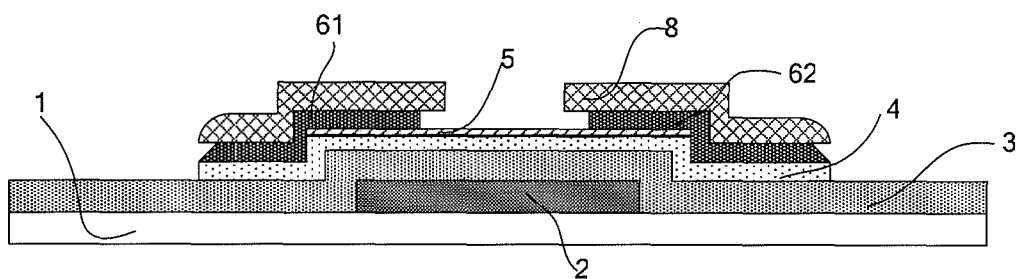
FIG. 3 is a schematic diagram after forming a source electrode and a drain electrode by etching in a preparation method for the array substrate provided by the embodiments of the present invention.
Figure 4:
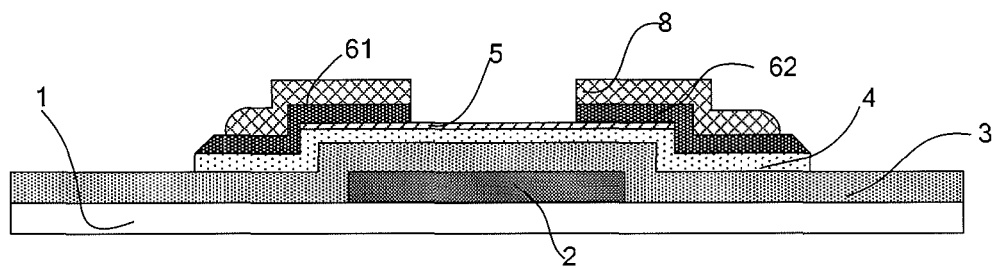
FIG. 4 is a schematic diagram of the array substrate provided by the embodiments of the present invention after the edge of photoresist is treated in the preparation method for the array substrate.
Figure 5:
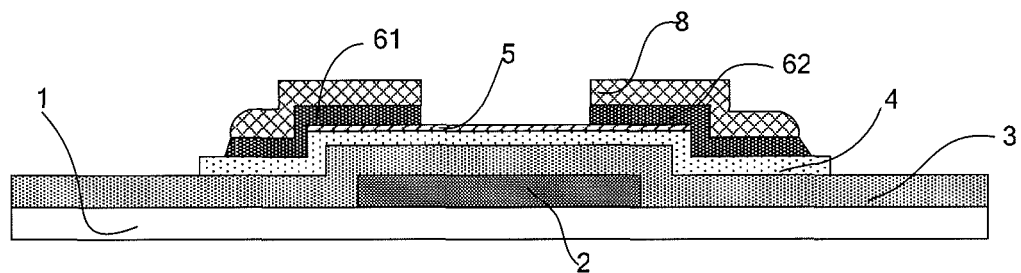
FIG. 5 is a schematic diagram of the array substrate provided by the embodiments of the present invention after the outer edges of the source electrode and the drain electrode are etched in the preparation method for the array substrate.

With reference to FIG. 3 to FIG. 5, wherein FIG. 3 is a schematic diagram of the array substrate provided by the embodiments of the present invention after a source electrode and a drain electrode are formed by etching in a preparation method for the array substrate; FIG. 4 is a schematic diagram of the array substrate provided by the embodiments of the present invention after the edge of photoresist is treated in the preparation method for the array substrate; and FIG. 5 is a schematic diagram of the array substrate provided by the embodiments of the present invention after the outer edges of the source electrode and the drain electrode are etched in the preparation method for the array substrate.

It can be known by a person skilled in the art that the process of forming the source electrode 61 and the drain electrode 62 on the substrate 1 comprises the following process: coating a photoresist on a source-drain electrode layer, exposing and developing the photoresist to form the pattern of the photoresist 8 shown in FIG. 3, and then forming the source electrode 61 and the drain electrode 62 by means of wet etching.

Specifically, step 1 further comprises the following steps:

step 101: coating a layer of source-drain electrode layer film above the pattern of the active layer, coating a photoresist on the source-drain electrode layer film, exposing and developing, and then etching the source-drain electrode layer film to form the source electrode and the drain electrode; and step 102: as shown in FIG. 4, treating the outer edge of the photoresist 8 reserved on the source electrode 61 and the drain electrode 62, so as to expose the source electrode 61 and the drain electrode 62 below the outer edge of the photoresist 8.

Specifically, in the step, the photoresist 8 is bombarded by sulphur hexafluoride and oxygen to shrink, so as to expose the source electrode 61 and the drain electrode 62 below the edge of the photoresist 8. Because the main ingredient of the photoresist 8 is phenolic resin, the surface of the photoresist 8 is liable to be oxidized by charging oxygen, so the treated photoresist 8 shrinks, and moreover, the process of oxidizing the photoresist 8 is an isotropic process, that is, the shrinking rates of the photoresist 8 in a vertical direction and a horizontal direction are the same, thus presenting the shape shown in FIG. 4. It needs to be noted that, the pattern of the photoresist 8 shown in FIG. 3 is above the electric conduction area of the active layer 4, and the pattern of the photoresist 8 is projected out of the areas of the source electrode and the drain electrode, which is resulted from the anisotropy during the wet etching for the source electrode and the drain electrode. Whereas during a further treatment process for the photoresist 8 above, both the inner edge and the outer edge of the photoresist 8 shown in FIG. 3 shrink, however, the inner-side photoresist of the photoresist 8 is originally projected out of the source electrode and the drain electrode, so that the source electrode and the drain electrode below the inner edge of the photoresist cannot be exposed. Meanwhile, due to the existence of oxygen, the upper surface of the electric conduction area of the active layer 4 is oxidized to form a thin oxide film, thus blocking the sulphur hexafluoride gas from etching the active layer 4; and the source electrode 61 and the drain electrode 62 are under the protection of the photoresist 8, thus preventing the sulphur hexafluoride gas from etching the source electrode 61 and the drain electrode 62.

Specifically, in the process above, the content of sulphur hexafluoride is in a range of 30-50 sccm, the content of oxygen is in a range of 1500-2500 sccm, a power is in a range of 4500-5500 W, and a treatment time is in a range of 30-40 s.

Step 103: as shown in FIG. 5, etching the source electrode 61 and the drain electrode 62 exposed in step 102, so as to expose the active layer 4 below the outer edges of the source electrode 61 and the drain electrode 62 to form the exposure area of the active layer 4.

In the step, dry etching is specifically carried out on the exposed source electrode 61 and drain electrode 62 by chlorine and oxygen, thus exposing the active layer 4 below the source electrode 61 and the drain electrode 62 to form the exposure area of the active layer 4. According to the principle of dry etching, the selectivity ratio of the etching process can be controlled by selecting proper gases during etching for film layers made from different materials, that is, speed ratios during the etching for film layers made from different materials can be effectively controlled. In the solution, etching is carried out by chlorine and oxygen, and the selectivity ratios of the metal layers of the source electrode 61 and the drain electrode 62 are greater than that of the active layer 4, therefore, as shown in FIG. 5, when the source electrode 61 and the drain electrode 62 are etched off, the active layer 4 located below the same cannot be etched.

Specifically, in the process above, the content of chlorine is in a range of 800-1000 sccm, the content of oxygen is in a range of 1600-2000 sccm, a power is in a range of 3500-4500 W, a pressure is in a range of 30-40 mT, and a treatment time is in a range of 35-85 s.

Step 104: stripping off the photoresist on the source electrode and the drain electrode, so as to form the pixel electrode on the upper surfaces of the drain electrode, the exposure area of the active layer, and the gate insulation layer.

The preparation method for the array substrate provided by the present invention further comprises forming a pattern comprising ohmic contact layers 5 among the active layer 4, the source electrode 61 and the drain electrode 62 by the patterning process, and the ohmic contact layers are located in areas corresponding to the source electrode and the drain electrode, thus facilitating the ohmic contact performance between the active layer 4 and the source electrode 61 and the drain electrode 62.

Figure 6:
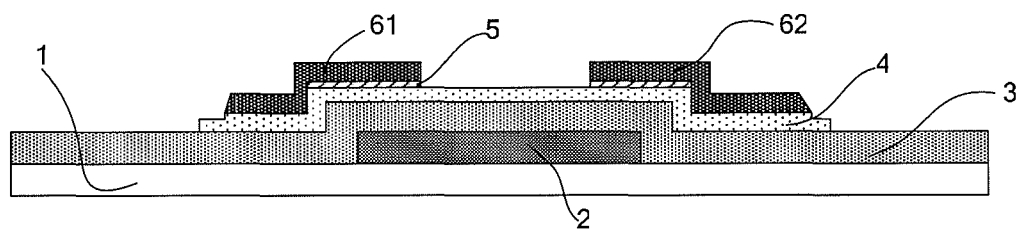
FIG. 6 is a schematic diagram of the array substrate provided by the embodiments of the present invention after ohmic contact layers are etched in the preparation method for the array substrate.

With reference to FIG. 6, FIG. 6 is a schematic diagram of the array substrate provided by the embodiments of the present invention after ohmic contact layers are etched in the preparation method for the array substrate.

Because the pattern comprising the ohmic contact layers 5 is formed on the substrate, in the present invention, step 1 further comprises etching the ohmic contact layers 5, specifically, after step 103, the ohmic contact layers 5 are etched by sulphur hexafluoride, chlorine and helium, the ohmic contact layer 5 between the source electrode 61 and the drain electrode 62 is removed, that is, the ohmic contact layer corresponding to the electric conduction area of the active layer 4 is removed, and the ohmic contact layers below areas corresponding to the source electrode 61 and the drain electrode 62 are reserved; and because the material of the active layer may be amorphous silicon or polycrystalline silicon, when the ohmic contact layers are etched, the exposure area of the active layer 4 is also partially etched, thus the thicknesses of the electric conduction area of the active layer 4 and the areas at the corresponding positions of the source electrode 61 and the drain electrode 62 are greater than the thickness of the exposure area of the active layer 4, as shown in FIG. 6, so as to form a step.

The present invention further discloses a display device, comprising an array substrate, wherein the array substrate is the array substrate above. The display device may be: any product or component with a display function, such as a liquid crystal display panel, electronic paper, an OLED (organic light emitting diode) panel, a mobile phone, a tablet computer, a television, a display, a notebook computer, a digital photo frame and a navigator.

The array substrate above has the technical effects above, thus the display effect of the display device using the array substrate above is better, and product yield is higher.

It should be understood that the above embodiments are only exemplary embodiments for illustrating the principle of the present invention, however, the present invention is not limited thereto. Various variations and improvements can be made by the person skill in the art without departing from the spirit and essence of the present invention, and these variations and improvements should also be considered to be within the protection scope of the present invention.

The invention claimed is:

1. An array substrate, comprising a gate electrode, a gate insulation layer, an active layer, a source electrode and a drain electrode, and a pixel electrode which are arranged on a substrate, wherein the active layer includes an electric conduction area, a coverage area covered by the source electrode and the drain electrode, and an exposure area surrounding the outer side of the coverage area, and the pixel electrode is lapped on the upper surfaces of the drain electrode, the exposure area of the active layer, and the gate insulation layer, wherein the thickness of the coverage area of the active layer is greater than that of the exposure area of the active layer.

2. The array substrate according to claim 1, wherein the width of the exposure area of the active layer is in a range of 0.5 μm-1.0 μm.

3. The array substrate according to claim 1, further comprising ohmic contact layers located between the active layer and the source electrode and the drain electrode, and the ohmic contact layers are covered by the source electrode and the drain electrode.

4. A display device, comprising an array substrate according to claim 1.

5. The display device according to claim 4, wherein the width of the exposure area of the active layer is in a range of 0.5 μm-1.0 μm.

6. The display device according to claim 4, wherein the array substrate further comprising ohmic contact layers located between the active layer and the source electrode and the drain electrode, and the ohmic contact layers are covered by the source electrode and the drain electrode.

7. A preparation method for the array substrate, comprising: forming a pattern comprising a gate electrode, a gate insulation layer, and a pattern comprising an active layer on a substrate, and further comprising:
   step 1: forming a source electrode and a drain electrode by a patterning process, so that the active layer includes an electric conduction area, a coverage area covered by the source electrode and the drain electrode, and an exposure area surrounding the outer side of the coverage area, wherein the thickness of the coverage area of the active layer is greater than that of the exposure area of the active layer; and
   step 2: forming a pixel electrode on the upper surfaces of the drain electrode, the exposure area of the active layer, and the gate insulation layer.

8. The preparation method for the array substrate according to claim 7, wherein the step 1 comprises:
   step 101: coating a layer of source-drain electrode layer film above the pattern of the active layer, coating photoresist on the source-drain electrode layer film, exposing and developing, and then etching the source-drain electrode layer film to form the source electrode and the drain electrode;

step 102: treating the photoresist reserved on the source electrode and the drain electrode, so as to expose the source electrode and the drain electrode below the outer edge of the photoresist;

step 103: etching the source electrode and the drain electrode exposed in step 102, so as to expose the active layer below the outer edges of the source electrode and the drain electrode to form the exposure area of the active layer; and step 104: stripping off the photoresist on the source electrode and the drain electrode.

9. The preparation method according to claim 8, wherein the step 102 comprises: bombarding the photoresist by sulphur hexafluoride and oxygen to shrink the photoresist, so as to expose the source electrode and the drain electrode below the outer edge of the photoresist.

10. The preparation method according to claim 9, wherein the content of sulphur hexafluoride is in a range of 30-50 sccm, the content of oxygen is in a range of 1500-2500 sccm, a bombarding power is in a range of 4500-5500 W, and a treatment time is in a range of 30-40 s.

11. The preparation method for the array substrate according to claim 8, wherein the step 103 comprises: etching the exposed source electrode and drain electrode by chlorine and oxygen.

12. The preparation method according to claim 11, wherein the content of chlorine is in a range of 800-1000 sccm, the content of oxygen is in a range of 1600-2000 sccm, a bombarding power is in a range of 3500-4500 W, a pressure is in a range of 30-40 mT, and a treatment time is in a range of 35-85 s.

13. The preparation method according to claim 8, wherein the step 101 further comprises: forming a pattern comprising ohmic contact layers among the active layer, the source electrode and the drain electrode by the patterning process.

14. The preparation method for the array substrate according to claim 13, wherein the step 101 further comprises: etching the ohmic contact layers by sulphur hexafluoride, chlorine and helium, so as to remove the ohmic contact layer corresponding to the electric conduction area of the active layer, and reserve the ohmic contact layer below areas corresponding to the source electrode and the drain electrode; meanwhile, partially etching the exposure area of the active layer so that the thickness of the coverage area of the active layer is greater than that of the exposure area of the active layer.

* * * * *